(12) United States Patent
Brandon, II et al.

(10) Patent No.: US 10,624,187 B2
(45) Date of Patent: Apr. 14, 2020

(54) LIGHT EMITTING DIODE DRIVER REGULATED TO CONSUME CONSTANT BATTERY CURRENT INPUT

(71) Applicant: Energizer Brands, LLC, Saint Louis, MO (US)

(72) Inventors: Michael J. Brandon, II, North Ridgeville, OH (US); David Spartano, Brunswick, OH (US)

(73) Assignee: Energizer Brands, LLC, Saint Louis, MO (US)

( * ) Notice: Subject to any disclaimer, the term of this patent is extended or adjusted under 35 U.S.C. 154(b) by 0 days.

(21) Appl. No.: 15/049,819

(22) Filed: Feb. 22, 2016

(65) Prior Publication Data

US 2017/0245335 A1    Aug. 24, 2017

(51) Int. Cl.
| | |
|---|---|
| *H05B 33/08* | (2020.01) |
| *H05B 45/10* | (2020.01) |
| *H05B 45/20* | (2020.01) |
| *H05B 45/37* | (2020.01) |
| *H05B 45/395* | (2020.01) |
| *G01R 19/165* | (2006.01) |

(52) U.S. Cl.
CPC .......... *H05B 45/10* (2020.01); *H05B 45/20* (2020.01); *H05B 45/37* (2020.01); *H05B 45/395* (2020.01); *G01R 19/16542* (2013.01)

(58) Field of Classification Search
CPC .......... G01R 19/16542; H02J 7/0026; H02J 7/0031; H05B 33/0812; H05B 33/0815; H05B 33/0827; H05B 33/0851; H05B 33/0866; H05B 33/0872; H05B 37/0272
See application file for complete search history.

(56) References Cited

U.S. PATENT DOCUMENTS

| | | | |
|---|---|---|---|
| 6,095,661 A | * | 8/2000 | Lebens ............ F21L 4/027 362/184 |
| 6,586,890 B2 | | 7/2003 | Min et al. |
| 7,569,996 B2 | * | 8/2009 | Holmes ............ H05B 33/0815 315/291 |
| 7,990,081 B2 | | 8/2011 | Chandran et al. |
| 8,299,726 B2 | | 10/2012 | Holmes et al. |
| 9,055,634 B2 | | 6/2015 | McDermott |
| 2003/0076051 A1 | * | 4/2003 | Bowman ............ H05B 33/0815 315/200 A |
| 2007/0212596 A1 | * | 9/2007 | Nebrigic ............ H01M 10/44 429/61 |

(Continued)

FOREIGN PATENT DOCUMENTS

DE      10333418 A1 * 2/2005 ............ F21L 4/00

OTHER PUBLICATIONS www.diodes.com/catalog/LED_Drivers_67. Analog Product Line. Diodes, Incorporated, Plano, TX.

(Continued)

*Primary Examiner* — Tung X Le
*Assistant Examiner* — Borna Alaeddini
(74) *Attorney, Agent, or Firm* — Alston & Bird LLP

(57) ABSTRACT

A light-emitting diode (LED) driver circuit monitors battery input current by way of a feedback resistor. The observed resistor voltage is provided to a regulator circuit which adjusts the current provided to the LED so as to hold the battery current substantially constant.

11 Claims, 5 Drawing Sheets

(56) References Cited

U.S. PATENT DOCUMENTS

| | | | |
|---|---|---|---|
| 2009/0189547 A1* | 7/2009 | Spartano | H01M 6/50 |
| | | | 315/307 |
| 2010/0213842 A1* | 8/2010 | Geris | G03B 15/05 |
| | | | 315/33 |
| 2012/0293092 A1* | 11/2012 | Yim | H05B 33/0854 |
| | | | 315/308 |
| 2014/0139114 A1* | 5/2014 | Garcia | H05B 37/0218 |
| | | | 315/151 |
| 2014/0312785 A1 | 10/2014 | McDermott | |
| 2015/0061543 A1* | 3/2015 | Pierce | H05B 33/0845 |
| | | | 315/307 |
| 2015/0156830 A1* | 6/2015 | Ma | H05B 33/0815 |
| | | | 315/291 |
| 2015/0257230 A1* | 9/2015 | Lee | H05B 33/0851 |
| | | | 315/186 |

OTHER PUBLICATIONS

Bell, Cliff, "What gives with Philips, Leds and PWM", *Pulse,* Sep. 23, 2015, retrieved from <https://www.linkedin.com/pulse/what-gives-philips-leds-pwm-cliff-bell> on Jan. 26, 2017, 7 pages.

\* cited by examiner

LIGHT EMITTING DIODE DRIVER REGULATED TO CONSUME CONSTANT BATTERY CURRENT INPUT

FIELD OF INVENTION

The present invention relates to an improved method and apparatus for powering handheld electronic devices utilizing light emitting diodes in combination with batteries (and possibly other power sources) that exhibit a decline in voltage during extended periods of time and/or use of the device.

BACKGROUND

Many electronic devices use consumer-replaceable batteries to power the device. Consumer-replaceable batteries are sold in standard sizes and voltages, with 1.5 volt, AA-sized zinc-manganese dioxide (i.e., alkaline) batteries being the most common primary battery. Other primary and secondary battery types found in the market today may take a variety of forms, from cylindrical (AA, AAA, C, D, etc.) to button or coin sized cells. The battery chemistry for such batteries is equally broad, including nickel-metal hydride, lithium-iron disulfide, lithium-manganese dioxide, zinc-air and carbon-zinc electrochemical systems, with the voltage for each dictated by the electrochemical reaction inherent thereto. While most consumer-replaceable batteries output nominal, direct voltages of 1.5 or 3.0 volts, the foregoing demonstrates that consumer-replaceable batteries encompass a wide range of possibilities. It should be noted that the International Electrotechnical Commission and the American National Standards Institute publish specifications for such batteries.

Although devices consumer-replaceable batteries cover a wide range of different applications, flashlights—and particularly flashlights utilizing at least one light emitting diode ("LED")—are perhaps the most ubiquitous. Device manufacturers tend to prefer consumer-replaceable batteries in flashlights for their low cost, convenience, portability and familiarity.

Prior to the development of LEDs, flashlights used incandescent light bulbs. These bulbs employ current to heat a wire filament to produce incandescent light. However, most batteries—and particularly alkaline batteries that are most commonly used in such devices—experience a steady decline in output voltage over the period of time during which the battery is discharged. As a result, incandescent flashlights often experienced a corresponding degradation in light output as the batteries were discharged. For purposes of this disclosure, the relationship between battery degradation and lighting performance can be characterized as passive, insofar as no circuitry or hardware is provided to address this issue.

As LEDs began to replace incandescent bulbs in flashlights, a separate series of issues arose. First, LED output (i.e., the quality of the light as perceived by an observer) depends, in part, on the current fed to the LED and the temperature of the LED itself. If the battery current is not tuned to the LED requirements, excess heat will be generated according Joule's First Law and, as a consequence, the LED performance will be impaired. In a similar manner, the declining output voltage of batteries during discharge, and particularly alkaline batteries (which exhibit a more pronounced decline in comparison to the chemistry of other batteries, such as lithium-iron disulfide), necessarily and passively impairs the LED output.

In response to these issues, LED flashlight manufacturers employed a number of approaches. The most prevalent approach was to employ circuitry or hardware to maintain a constant current for the LED. FIG. 1A generally illustrates how the battery current, $I_{bat}$, and the LED current, LED, would behave over time. In practice, this approach is active insofar as it requires hardware to be interposed between the battery and the LED in order to make the necessary adjustments. This approach effectively established a feedback loop between the LED and the driver circuit (e.g., an integrated chip) in order to insure the current was maintained at a constant level.

U.S. Pat. No. 8,299,726 discloses a power supply for an LED device that sense current through an LED and utilizes a switch-mode regulator to provide a substantially constant current output to the LED by adjusting the switch-mode regulator as a function of the current sensed.

U.S. Pat. No. 6,586,890 discloses a system for powering an LED including an oscillator that supplies output power to the LED only when the oscillator signal is in a particular condition.

U.S. Pat. No. 9,055,634 describes an LED light source energized with an effective power in accordance with a targeted illuminating resistance. Numerous schemes are disclosed for decreasing the voltage and/or supplying a constant current to the LED.

FIG. 1B schematically illustrates a generic output regulation scheme 10 of the prior art. Battery provides a current $I_B$ to the input $P_{in}$ of an integrated circuit 15. The integrated circuit 15 acts as a driver from the LED (or an array of LEDs) by way of its output $P_{out}$. A feedback loop FB is established based on the current $I_{LED}$ flowing through the LED so as to allow regulation of output $P_{out}$ to optimize the performance of the LED.

Another approach to implementing LEDs while minimizing the aforementioned issues was for the flashlight manufacturer simply to design components that were optimized to a particular voltage and discharge profile (i.e., to design the light to a specific battery chemistry). In doing so, it is often assumed that the consumer-replaceable batteries will be primary alkaline cells (i.e., a 1.5 volt zinc-manganese dioxide battery having standardized size/form factor, such as LR6), which possess discharge characteristics that are distinct from other batteries electro/chemical cells. Under this approach, the components (e.g., diodes, heat sinks, etc.) are selected to handle current outputs of an alkaline battery.

When this chemistry-specific type of design is utilized, the use of a different battery has inevitable negative results. For example, when batteries with a higher output voltage and, by operation of Ohm's law, current (e.g., lithium-iron disulfide batteries) are used in such lights, the excess current results in the generation of excess heat. In some cases, the disparity between the battery output and design is sufficient to damage the light and/or to cause its operation and light output to be significantly impaired. While flashlight manufacturers sometimes attempted to overcome this issue by recommending only a particular type of battery, this passive solution may be ineffective because it relies entirely upon a sometimes unsophisticated user to recognize the differences in battery chemistry for cells that otherwise had the same appearance and nominal voltage and act accordingly. In the same manner, schemes to detect battery chemistry can be complex and often too expensive for use in everyday flashlights.

Finally, the implementation of LEDs in lighting devices created another issue: because of an LED's increased sensitivity to current levels, previous schemes for dimming incandescent lights were not feasible. That is, while an incandescent bulb could be dimmed simply by reducing the current so as to reduce the generation of heat and incandescent effect, LED bulbs proved to be too sensitive to current changes to make this approach feasible. Consequently, light manufacturers began to include features such pulse width modulation (PWM) of the current provided to the LED. In these schemes, PWM was designed to essentially deactivate the LED a sufficient number of times within the modulation cycle so as to create a perceptible dimming effect for the user even though the actual light intensity of the LED was not (and cannot be) altered.

For example, United States patent publication no. 2015/0257230 describes an LED driver unit that sense current flowing through an LED array. A dimming control unit then relies on a voltage divider unit in order to dim the LED array.

The inventors are also aware of integrated circuits sold as an LED driver made by Diode, Inc. of Plano, Tex., USA (www.diodes.com/catalog/LED_Drivers_67). These drivers are sold as low voltage DC-DC LED drivers specifically designed for portable lighting applications. Some of these drivers include boost-buck operations to adjust voltage, but the drivers are all generally described as providing high efficiency constant current for high brightness LEDs with both high and low current.

Given the foregoing, there is a need for an LED lighting device that is responsive to the current delivered by the battery so as to prolong run-time rather than maintain specific conditions for LED operation. This need also encompasses a method for driving an LED by establishing a feedback loop between the driver and the battery itself.

SUMMARY OF INVENTION

The description and accompanying drawings illustrate various systems, apparatuses, devices and related methods constituting various embodiments of the invention. One particular embodiment contemplates a lighting device having any combination of the following features:
  at least one light emitting diode;
  a portable power source delivering direct current, said current supplied by at least one battery; and
  an LED driver connected to the portable power source on an input side and the light emitting diode on an output side, wherein the LED driver maintains the direct current received from the portable power source at a predetermined level selected to maximize discharge time of the portable power source;
  wherein the predetermined level of direct current is between a current delivered by the battery at 5% or less depth of discharge and a minimum current required by the light emitting diode to produce light that is visible to an unassisted human eye;
  wherein the portable power source consists of at least two batteries;
  wherein the batteries are provided in a series relationship; and/or
  circuitry to produce a low battery warning when the direct current received from the portable power device can no longer sustain the predetermined level.

Another embodiment contemplates, in a lighting device having at least one battery providing an input to an LED driver mechanism and the LED driver mechanism providing an output to at least one light emitting diode, a method comprising any combination of the following features:
  sensing the current of the input;
  adjusting the output of the LED driver mechanism to restrict the current to a predetermined level;
  wherein the predetermined level is held constant during operation of the lighting device until the current of the input can no longer sustain the output required to produce light that is visible to an unassisted human eye; and/or
  wherein a low battery signal is indicated by the lighting device at a point in time at or after a point in time at which the battery cannot deliver current at the predetermined level.

Yet another embodiment contemplates, in a lighting device having at least one battery providing an input current to an LED driver and at least one light emitting diode providing an output current, a method comprising any combination of the following features:
  periodically sensing the output current;
  comparing the sensed output current to a predetermined schedule generated to optimize run-time of the light emitting diode; and/or
  adjusting the input current received by the LED driver from the battery until the sensed output current agrees with the predetermined schedule.

BRIEF DESCRIPTION OF THE DRAWINGS

The accompanying drawings illustrate various systems, apparatuses, devices and related methods, in which like reference characters refer to like parts throughout, and in which.

DETAILED DESCRIPTION

Figure 1A:
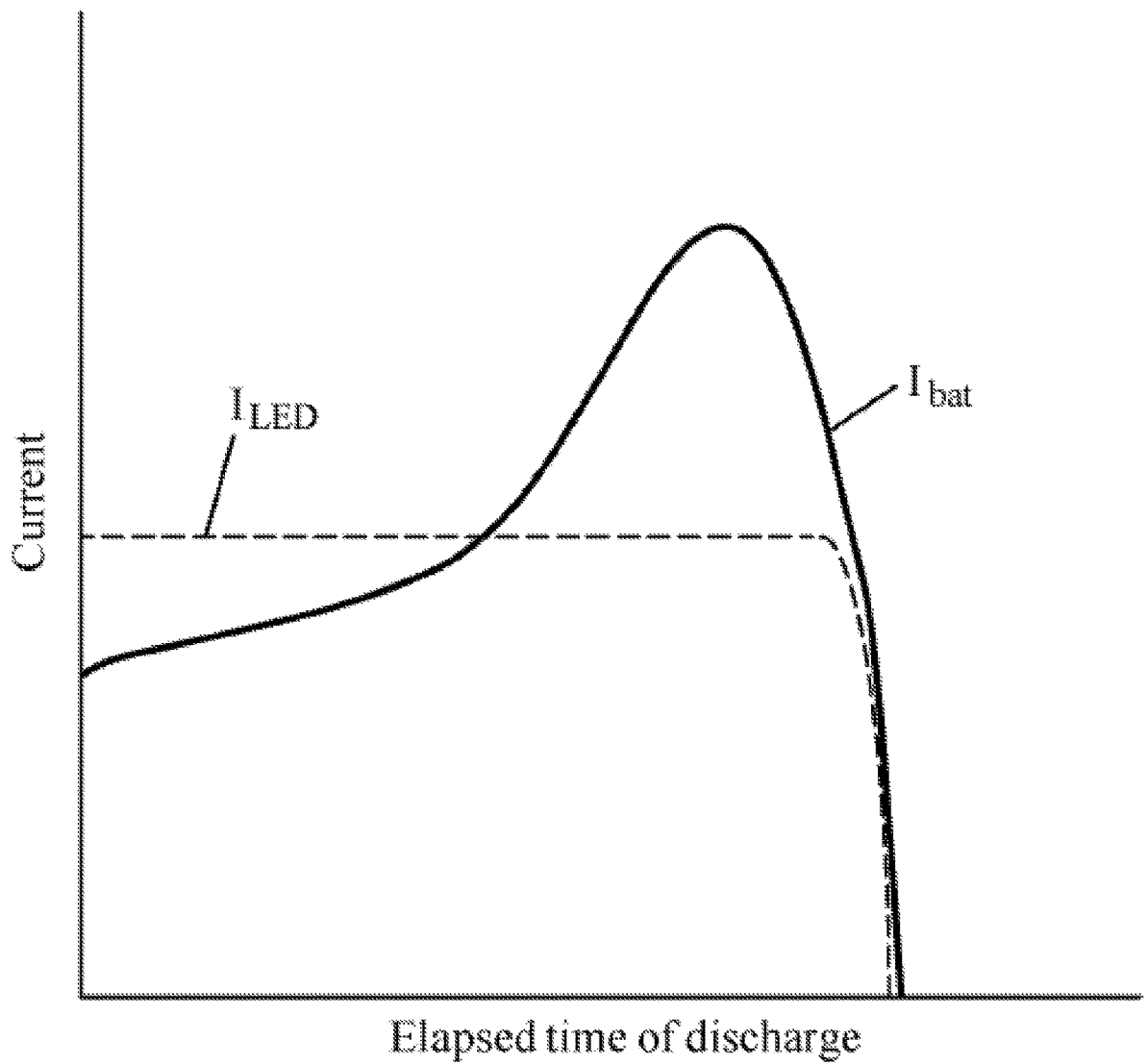
FIG. 1A is a generalized illustration of the relationship between the battery and LED current, as measured along the y-axis, and the "on-time" of the device, as measured along the x-axis, according to the prior art.
Figure 1B:
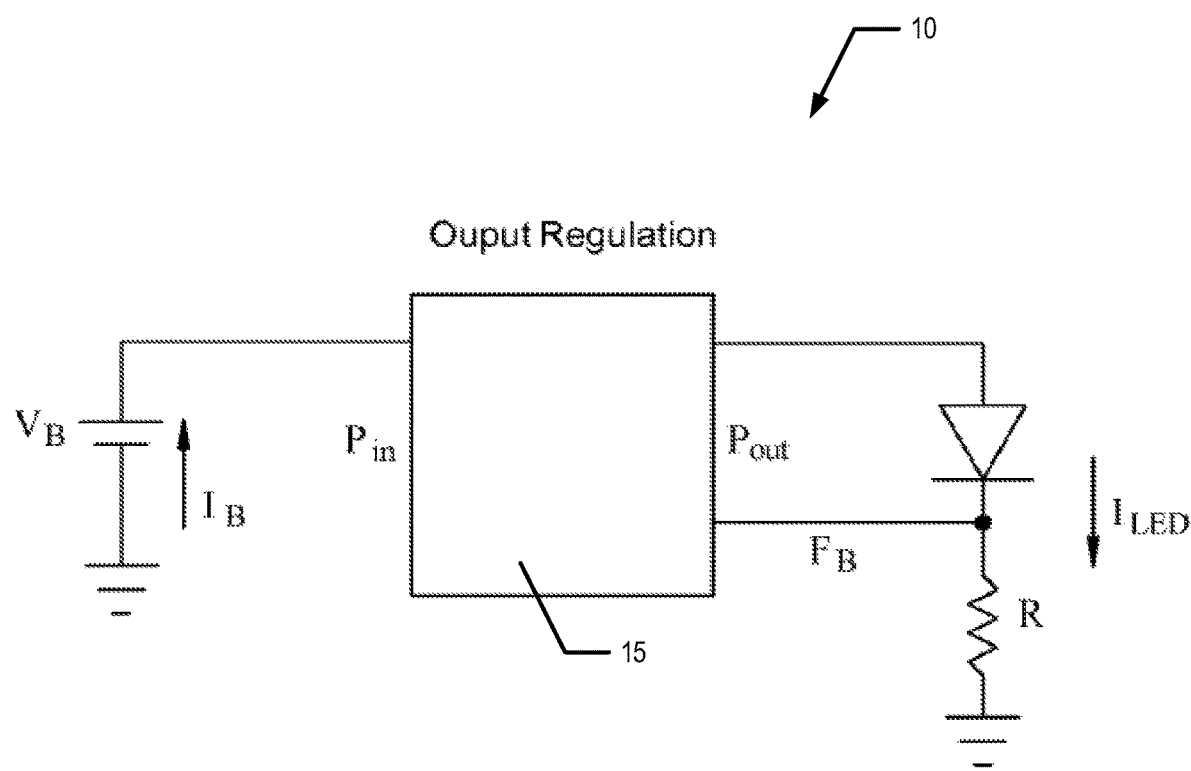
FIG. 1B is a schematic representation of a lighting device driver according to the prior art.

Reference will now be made to exemplary embodiments, examples of which are illustrated in the accompanying drawings. It is to be understood that other embodiments may be utilized and structural and functional changes may be made. Moreover, features of the various embodiments may be combined or altered. As such, the following description is presented by way of illustration only and should not limit in any way the various alternatives and modifications that may be made to the illustrated embodiments. In this disclosure, numerous specific details provide a thorough understanding of the subject disclosure. It should be understood that aspects of this disclosure may be practiced with other embodiments not necessarily including all aspects described herein, etc.

As used herein, the words "example" and "exemplary" means an instance, or illustration. The words "example" or "exemplary" do not indicate a key or preferred aspect or embodiment. The word "or" is intended to be inclusive rather than exclusive, unless context suggests otherwise. As an example, the phrase "A employs B or C," includes any inclusive permutation (e.g., A employs B; A employs C; or A employs both B and C). As another matter, unless context suggest otherwise, the articles "a" and "an" are generally intended to mean "one or more" and the use of plural may be exemplary rather than mandatory.

The inventors now propose to use the input current and/or input power from the battery itself as a feedback source. More specifically, if the input conditions from the battery can be held substantially constant, a minimum runtime for the LED can be assured. Although this approach might degrade output (particularly as suggested in some of the publications noted above), the inventors have found that consumers actually prefer battery-powered lighting devices' run-time to be optimized even if it is at the expense of the perceived quality of the light output by the device.

In particular, because the runtimes based on constant current and/or constant power battery drains can be determined, the light (i.e., the LED device) itself can be designed to select a battery drain that provides a desired runtime. This selection can be hardwired or possibly engineered into a selection criteria determined by the user. In one embodiment, the user might input the desired run time (or a generic approximation or setting that is representative thereof) upon installing fresh batteries, and the integrated circuit driver within the light would respond accordingly.

This approach eliminates the need to provide positive thermal coefficient (PTC) devices to accommodate the thermal issues that may be triggered by non-alkaline batteries, such as primary lithium batteries. The elimination of a PTC has an attendant cost advantage.

This approach also eliminates over-engineering (or, in the alternative, poorly engineered) devices. In particular, if a PTC device not provided, the device had to incorporate components (LEDs and/or heat sinks) capable of accommodating higher power and/or higher current output by lithium and other batteries. Absent such components, the entire device risked failure if a consumer did not strictly adhere to the recommended battery type for that device. Here again, the provision of overly robust components is not cost efficient.

In a further embodiment, it may be possible to monitor the battery current, power and/or voltage and to reduce energy drawn from the battery by way of pulse width modulation (PWM) output by the driver circuit. Such modulation would maintain the desired parameters for the LED current and temperature within a predetermined range. Significantly, this approach effectively downgrades the output provided to the LED(s) so as to optimize battery performance and, as such, is in contrast to previous teachings which suggested a variable pulse-width modulation to act as dimming switch.

Figure 2:
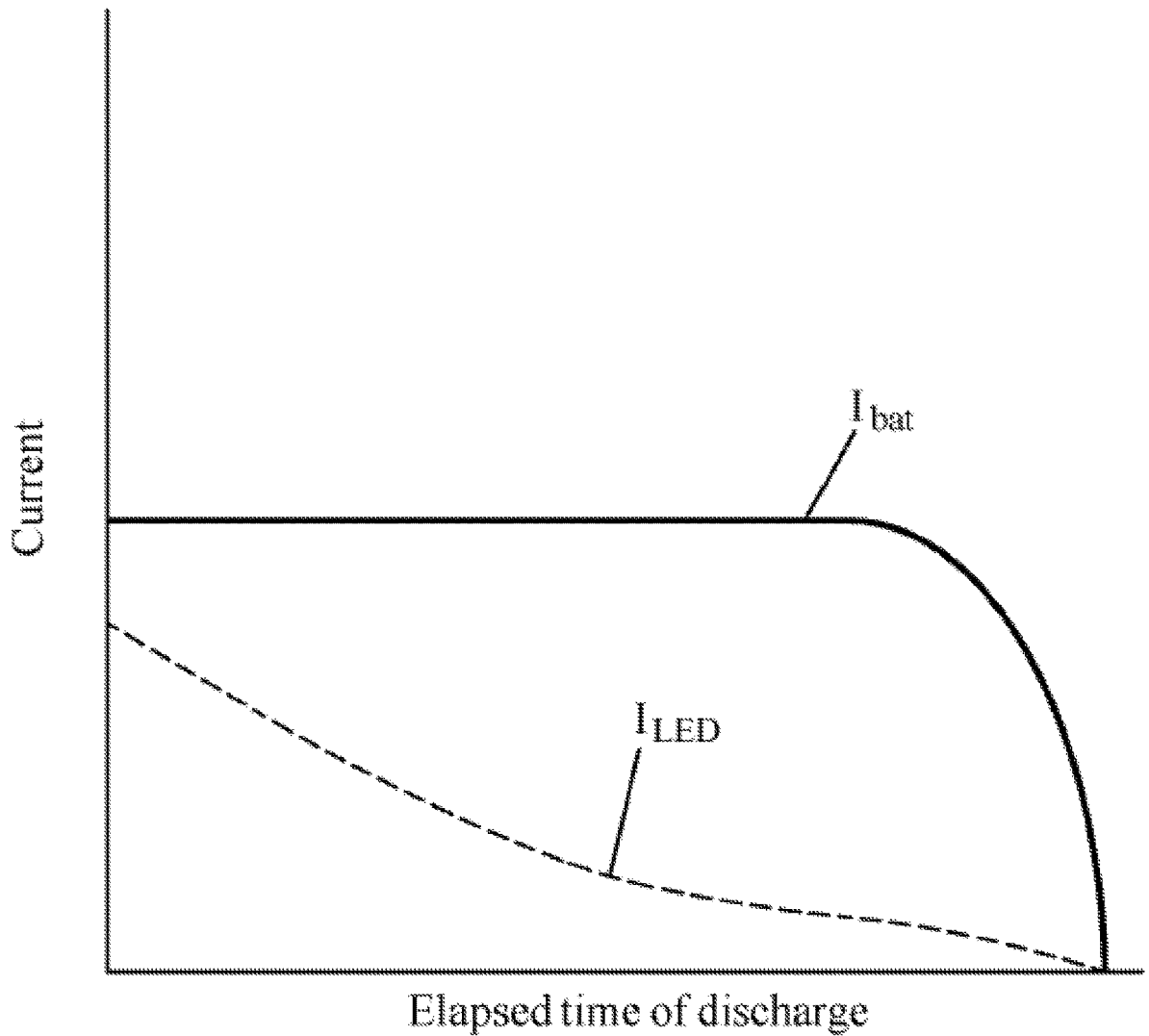
FIG. 2 is a generalized illustration of the relationship between the battery and LED current, as measured along the y-axis, and the "on-time" of the device, as measured along the x-axis, according to some embodiments of the invention.

FIG. 2 generically illustrates the concept of the invention. Rather than monitor the current of the LED, $I_{LED}$, as discussed above, the inventors propose to monitor the current provided by the battery itself. This monitoring is effectively "upstream" from the driver, and it limits the amount of current being initially drawn from the battery. This system will result in increased run-time for the flashlight itself, although the added run time may come at the expense of the quality of light provided by the LED during the later stages of discharge.

Figure 3:
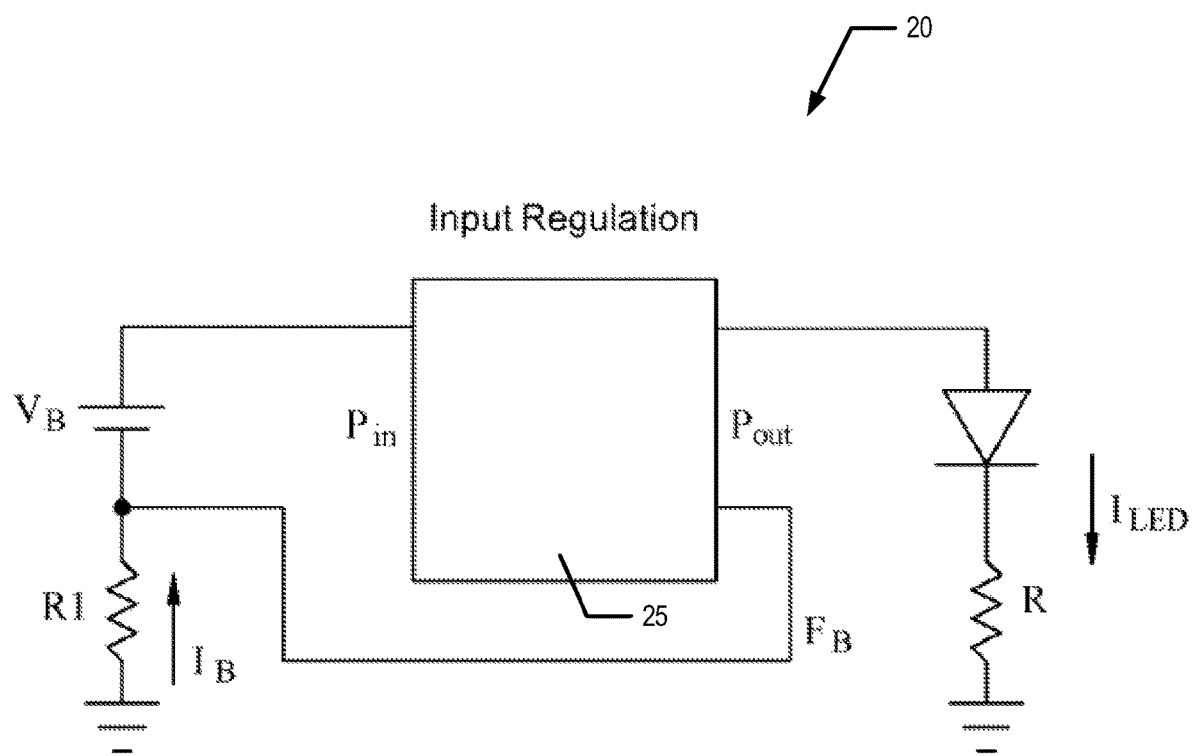
FIG. 3 is a schematic representation of a lighting device driver according to one embodiment of the invention.

One embodiment of the invention will be better understood by reference to FIG. 3, which shows one embodiment of the optimized LED driver circuit 20. In particular, in this input regulation scheme, the current $I_B$ from the battery is monitored through the feedback resistor R1. The driver 25 itself then adjusts the current output required so as to maintain a constant input current delivered by the battery. For example, the LED current $I_{LED}$ can be changed by adjusting the switching frequency of the regulator, e.g. by PWM, to adjust the output to the LED or by way of a variable resistor or other analog or digital circuitry schemes.

Notably, prior use of PWM directly adjusted the LED output level with the goal of maintaining a constant LED current while the power (which itself depends directly on battery voltage and current) changes. In contrast, certain embodiments of the invention adjust the LED output with PWM, but with a goal of maintaining a constant battery input current and without regard to the LED output. Over time, the light output of the LED will decrease when PWM is dictated by current sensing at the battery, but the constant battery input current will result in less unnecessary drain on the battery and, as a result, longer run time for the device.

In some embodiments, the battery current is simply held below some maximum level but without regard for boosting current that may otherwise be too low for optimal LED operation. In this scheme, if lithium batteries are used instead of alkaline, more input power is available. If unregulated the battery current could be quite high and cause thermal issues. By monitoring the battery current, it can be capped at some maximum value to prevent thermal issues.

Figure 4:
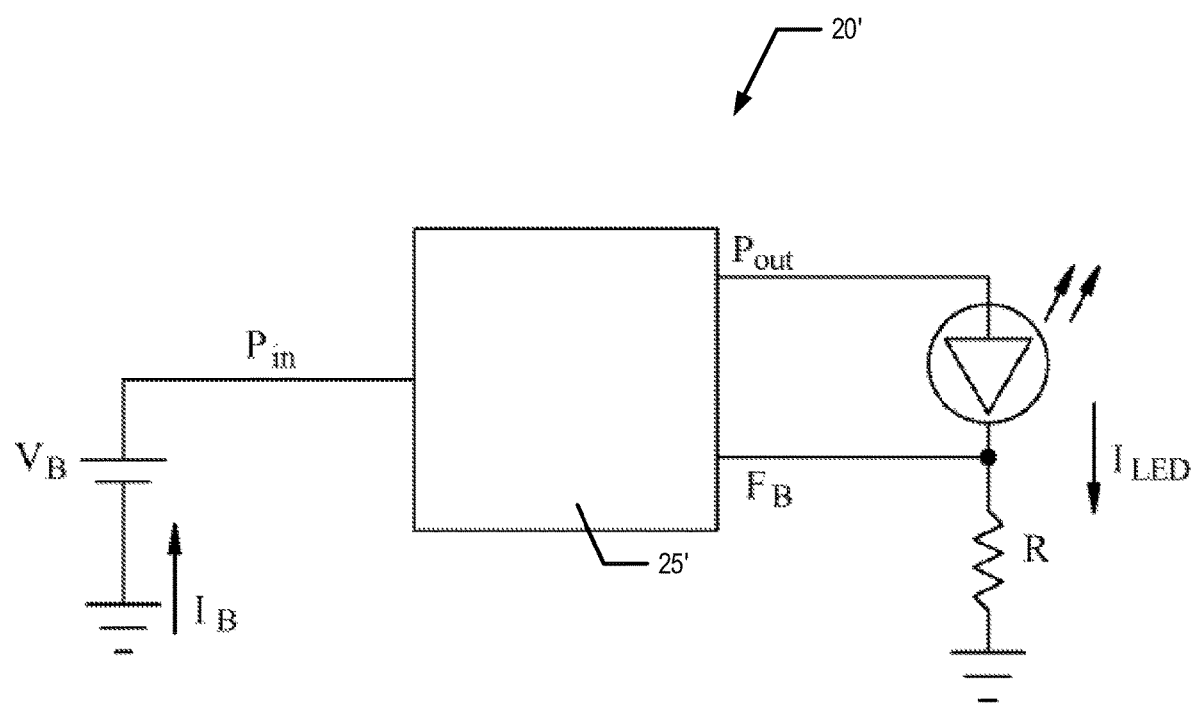
FIG. 4 is a schematic representation of a lighting device driver according to another embodiment of the invention.

A further embodiment of an optimized LED driver circuit 20' is shown in FIG. 4. Here, the LED current $I_{LED}$ is monitored to match a pre-determined output schedule. For example, the voltage is periodically checked to verify whether it is consistent with what is expected for a particular battery type working in conjunction with the other components of the system. If the voltage is higher than expected, the regulator (i.e., driver 25') modulates the current to the LED down to the desired level. Conceptually speaking, the LED performance profile is essentially optimized to a specific battery type (e.g., an alkaline battery, which possesses a less desirable discharge curve for LED operation), and if a higher performing battery is used (e.g., a lithium-iron disulfide battery), the driver 25' will be periodically adjusted to detune the LED's input requirements to meet the pre-programmed profile. Here again, the net result is increased run-time of the light at the potential expense of the quality of the LED output.

In the aforementioned embodiments, the driver 25, 25' is envisioned to be an integrated circuit capable of performing the method(s) contemplated therein. However, discrete analog components and/or other approaches for sensing current from the battery and adjusting the power drawn from the battery may be employed.

Further embodiments contemplate a method for driving LEDs. In these embodiments, a lighting device having a driver interposed between a battery and at least one LED is provided. The driver then monitors the current received from the battery to limit the current drawn from the battery to a predetermined level. The output of the driver is adjusted to be for suitable use by the LED, but the battery run-time effectively takes precedence over the LED output. In some embodiments, it may be possible to incorporate a low battery warning into the device, possibly by having the LED periodically flash or by incorporating a separate element (e.g., an audible sound, a separate indicator light, etc.) in order to alert the user when the current from the battery is at or has fallen below the predetermined level.

The foregoing description identifies various non-limiting embodiments of the invention. Modifications may occur to those skilled in the art and to those who may make and use the invention. The disclosed embodiments are merely for illustrative purposes and not intended to limit the scope of the invention or the subject matter set forth in the claims.

What is claimed is:

1. A lighting device comprising:
   at least one light emitting diode (LED);
   a portable power source delivering direct current, said current supplied by at least one battery; and
   an LED driver having an input side and an output side, the LED driver is (a) connected to the portable power source on the input side, (b) configured to receive an input current from the portable power source through the input side, (c) connected to the LED on the output side, and (d) configured to provide an LED current to the LED through the output side,
   wherein the LED driver monitors the input current received by the LED driver from the portable power source via a feedback resistor electrically connected to the portable power source and adjusts the LED current such that the LED current decreases over time so as to maintain the input current received from the portable power source at a constant, predetermined level, said constant, predetermined level selected based on a desired runtime of the lighting device and being below a predetermined maximum input current threshold, wherein the maximum input current threshold is configured to maintain the at least one LED in a predetermined temperature range.

2. The lighting device of claim 1 wherein the predetermined level of direct current is between a current delivered by the battery at 5% or less depth of discharge and a minimum current required by the light emitting diode to produce light that is visible to an unassisted human eye.

3. The lighting device of claim 1 wherein the portable power source consists of at least two batteries.

4. The lighting device of claim 3 wherein the batteries are provided in a series relationship.

5. The lighting device of claim 1 further comprising circuitry to produce a low battery warning when the portable power device can no longer sustain the input current at the predetermined level.

6. The lighting device of claim 1, wherein the desired runtime is provided via user input.

7. The lighting device of claim 1, wherein the desired runtime is a maximum runtime for the portable power source.

8. In a lighting device having at least one battery providing an input current to a light emitting diode (LED) driver mechanism and the LED driver mechanism providing an LED current to at least one LED, a method comprising:
   sensing the input current via a feedback resistor electrically connected to the battery; and
   adjusting the LED current provided to the at least one LED by the LED driver mechanism to restrict the input current provided by the at least one battery to the LED driver mechanism to a constant, predetermined level, said constant, predetermined level selected based on a desired runtime of the lighting device and being below a predetermined maximum input current threshold, wherein the maximum input current threshold is determined such that operation of the lighting device with an input current below the maximum input current threshold is configured to maintain the at least one LED in a predetermined temperature range.

9. The method according to claim 8, wherein the predetermined level is held constant during operation of the lighting device until the input current can no longer sustain the output required to produce light that is visible to an unassisted human eye.

10. The method of claim 9, wherein a low battery signal is indicated by the lighting device at a point in time at or after a point in time at which the battery cannot deliver input current at the predetermined level.

11. In a lighting device comprising at least one battery, a light emitting diode (LED) driver, and at least one LED, wherein the at least one battery provides an input current to the LED driver, the LED driver provides an LED current to the at least one LED, and the at least one LED provides an output current, a method comprising:
   periodically sensing the output current;
   comparing the sensed output current to a predetermined schedule generated to optimize run-time of the at least one LED for a battery type corresponding to the at least one battery; and
   adjusting, by the LED driver, the LED current provided to the at least one LED until the sensed output current agrees with the predetermined schedule and the input current is below a predetermined maximum input current threshold, wherein the maximum input current threshold is determined such that operation of the lighting device with an input current below the maximum input current threshold is configured to maintain the at least one LED in a predetermined temperature range.

* * * * *